United States Patent
Tormey et al.

(10) Patent No.: US 7,343,590 B2
(45) Date of Patent: Mar. 11, 2008

(54) SYSTEM AND METHOD FOR INCREASING OS IDLE LOOP PERFORMANCE IN A SIMULATOR

(75) Inventors: Daniel Tormey, Richardson, TX (US); Joe Bolding, Allen, TX (US); Matt Jacunski, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 988 days.

(21) Appl. No.: 10/178,992

(22) Filed: Jun. 25, 2002

(65) Prior Publication Data

US 2003/0237075 A1 Dec. 25, 2003

(51) Int. Cl.
*G06F 9/44* (2006.01)

(52) U.S. Cl. ............... 717/131; 717/135; 718/100; 718/107; 718/108; 719/328

(58) Field of Classification Search .......... 703/21, 703/19, 22; 718/100, 107, 108; 717/131; 717/135; 719/328, 329
See application file for complete search history.

(56) References Cited

U.S. PATENT DOCUMENTS

| | | | | |
|---|---|---|---|---|
| 5,511,217 A * | 4/1996 | Nakajima et al. | ............ | 718/100 |
| 6,075,938 A * | 6/2000 | Bugnion et al. | ............... | 703/29 |
| 6,470,456 B1 * | 10/2002 | Chung-Chih | ................. | 713/322 |
| 6,523,155 B1 * | 2/2003 | Ruedinger | ....................... | 716/7 |
| 6,577,992 B1 * | 6/2003 | Tcherniaev al. | ............... | 703/14 |
| 6,886,162 B1 * | 4/2005 | McKenney | ................... | 718/102 |
| 6,928,645 B2 * | 8/2005 | Wang et al. | ................. | 718/102 |
| 6,952,825 B1 * | 10/2005 | Cockx et al. | ................ | 718/102 |
| 2003/0105983 A1 * | 6/2003 | Brakmo et al. | .............. | 713/320 |
| 2003/0149834 A1 * | 8/2003 | Susnjar | ........................ | 711/112 |
| 2003/0191615 A1 * | 10/2003 | Bailey et al. | .................. | 703/13 |
| 2005/0246565 A1 * | 11/2005 | Wright et al. | ................ | 710/260 |

OTHER PUBLICATIONS

John Sanguinetti, A Technique for Integrating Simulation and System Design, 1979 Conference on Simulation, Measurement and Modeling of Computer Systems, pp. 163-172.*
Richard M. Fujimoto, "Parallel Discrete Event Simulation", Communication of the ACM, Oct. 1990, vol. 33, No. 10, pp. 30-53.*
G. Chen, and B. K. Szymanski, "Lookahead, Rollback, and Lookback: Searching for Parallelism in Discrete Event Simulation," pp. 1-5, extra page showing the creation of PDF.*
J. Sanguinetti, "A Technique for Integrating Simulation and System Design," 1979 Conference on Simulation, Measurement and Modeling of Computer Systems, pp. 163-172.*

(Continued)

*Primary Examiner*—Hugh Jones
*Assistant Examiner*—Kibrom Gebresilassie

(57) ABSTRACT

A system and method for increasing Operating System (OS) idle loop performance in a simulator environment. Upon encountering an OS idle loop condition on a processor, OS program flow is skipped ahead by an amount of time, thereby conserving the host machine's resources that would otherwise have been spent in supporting the OS idle loop execution. If another processor initiates an inter-processor message directed to a processor whose OS program flow has been skipped forward, that processor is capable of skipping backward in time, if necessary, to service the inter-processor message.

29 Claims, 5 Drawing Sheets

OTHER PUBLICATIONS

Richard M. Fujimoto, "Parallel Discrete Event Simulation", Communication of the ACM, Oct. 1990.*

J. Sanguinetti "A technique for Integrating Simulation and System Design" 1979 Conference on Simulation, pp. 163-172.*

R. M. Fujimoto, "Parallel Discrete Event Simulation", communication of the ACM, Oct. 1990.*

J. Sanguinetti, "A technique for Integrating Simulation and System Design", 1979 Conference on Simulation.*

M. Rosenblum, E. Bugnion, S. Devine, and S. A. Herrod, "Using the SimOS Machine Simulator to Study Complex Computer Systems", 1997 ACM.*

A. Whitaker, M. Shaw, and S. D. Gribble, "Scale and Performance in the Denali Isolation Kernel", USENIX Association, May 29, 2002.*

Richard M. Fujimoto, "Parallel Discrete Event Simulation", Communication of the ACM, Oct. 1990, vol. 33, No. 10, pp. 30-53.*

G. Chen, and B. K. Szymanski, "Lookahead, Rollback, and Lookback: Searching for Parallelism in Discrete Event Simulation," pp. 1-5, extra page showing the creation of PDF, Jun. 2002.*

J. Sanguinetti, "A Technique for Integrating Simulation and System Design," 1979 Conference on Simulation, Measurement and Modeling of Computer Systems, pp. 163-172.*

* cited by examiner

SYSTEM AND METHOD FOR INCREASING OS IDLE LOOP PERFORMANCE IN A SIMULATOR

CROSS-REFERENCE TO RELATED APPLICATION(S)

This application discloses subject matter related to the subject matter disclosed in the following commonly owned patent application(s): (i) "System And Method For Increasing Performance In Multi-CPU Simulation," filed even date herewith, application Ser. No. 10/178,967, now U.S. Patent Application Publication No. 2003/0237076 A1.

BACKGROUND OF THE INVENTION

1. Technical Field of the Invention

The present invention generally relates to computer systems. More particularly, and not by way of any limitation, the present invention is directed to a system and method for increasing Operating System (OS) idle loop performance in a simulator environment.

2. Description of Related Art

Architectural simulators are often used to simulate a target hardware platform, whereby a simulated execution environment can "execute" a particular piece of software intended for the target hardware as if it were run on the actual machine itself. The target hardware platform may be comprised of any known computer architecture. For various reasons, simulators operable to simulate multiprocessor (MP) computer systems are more prevalent. Because the teachings of the present invention are particularly exemplified within the context of MP platforms in addition to a single-CPU platform, a brief introduction thereto is immediately set forth below.

In the most general sense, multiprocessing may be defined as the use of multiple processors to perform computing tasks. The term could apply to a set of networked computers in different locations, or to a single system containing several processors. As is well known, however, the term is most often used to describe an architecture where two or more linked processors are contained in a single or partitioned enclosure. Further, multiprocessing does not occur just because multiple processors are present. For example, having a stack of personal computers in a rack is not multiprocessing. Similarly, a server with one or more "standby" processors is not multiprocessing, either. The term "multiprocessing" is typically applied, therefore, only to architectures where two or more processors are designed to work in a cooperative fashion on a task or set of tasks.

There exist numerous variations on the basic theme of multiprocessing. In general, these variations relate to how independently the processors operate and how the workload among these processors is distributed. In loosely-coupled multiprocessing architectures, the processors perform related tasks but they do so as if they were standalone processors. Each processor is typically provided with its own private memory and may have its own mass storage and input/output (I/O). Further, each loosely-coupled processor runs its own copy of an operating system (OS), and communicates with the other processor or processors through a message-passing scheme, much like devices communicating over a local area network. Loosely-coupled multiprocessing has been widely used in mainframes and minicomputers, but the software to effectuate MP activity is closely tied to the hardware design. For this reason, among others, it has not gained the support of software vendors and is not widely used in today's high performance server systems.

In tightly-coupled multiprocessing, on the other hand, operation of the processors is more closely integrated. They typically share main memory, and may even have a shared cache. The processors need not be identical to one another, and may or may not perform similar tasks. However, they typically share other system resources such as mass storage and I/O. Additionally, instead of a separate copy of the OS for each processor, they run a single copy, with the OS handling the coordination of tasks between the processors. The sharing of system resources makes tightly-coupled multiprocessing platforms somewhat less expensive, and it is the dominant multiprocessor architecture in the business-class servers currently deployed.

Hardware architectures for tightly-coupled MP platforms can be further divided into two broad categories. In symmetrical MP (SMP) systems, system resources such as memory, disk storage and I/O are shared by all the microprocessors in the system. The workload is distributed evenly to available processors so that one does not sit idle while another is heavily loaded with a specific task. Further, the SMP architecture is highly scalable, i.e., the performance of SMP systems increases, at least theoretically, as more processor units are added.

In asymmetrical MP (AMP) systems, tasks and resources are managed by different processor units. For example, one processor unit may handle I/O and another may handle network OS (NOS)-related tasks. Thus, it should be apparent that an asymmetrical MP system may not balance the workload and, accordingly, it is possible that a processor unit handling one task can be overworked while another unit sits idle.

SMP systems are further subdivided into two types, depending on the way cache memory is implemented. "Shared-cache" platforms, where off-chip (i.e., Level 2, or L2) cache is shared among the processors, offer lower performance in general. In "dedicated-cache" systems, every processor unit is provided with a dedicated L2 cache, in addition to its on-chip (Level 1, or L1) cache memory. The dedicated L2 cache arrangement accelerates processor-memory interactions in the multiprocessing environment and, moreover, facilitates better scalability.

Regardless of which type of the target platform is simulated, a simulator is typically run on a host machine that may itself be a high-performance computer system having MP capability. During the execution of the simulator and any code run on the simulated platform, the host machine expends its own resources, e.g., processor cycles, memory accesses, and the like, in order to execute the simulator software. Clearly, how effective and efficient a simulator is with respect to a target hardware platform depends on how it is run on the host machine, which in turn is based on how the host resources are utilized in the process of effectuating a simulation environment.

It should be readily apparent that consumption and conservation of host resources can be critical in both multi-CPU and single-CPU simulation environments. In particular, where an Operating System (OS) is provided as code under simulation to be executed on a specific target hardware platform, it is desirable that the performance of the simulator be maximized for efficient execution. Conventional simulation environments are not entirely satisfactory in this regard, however. Typically, when a simulated processor is engaged in executing OS idle loops, the host machine resources continue to be used up, thereby reducing the performance of the simulator. This situation leads to an especially wasteful condition in a lightly loaded OS where it spends a significant amount of time in executing idle loop instructions while waiting for an external event to occur or for time to pass.

SUMMARY OF THE INVENTION

Accordingly, the present invention advantageously provides a system and method for increasing Operating System (OS) idle loop performance in a simulator environment. Upon encountering an OS idle loop condition on a processor, OS program flow is skipped ahead by an amount of time, thereby conserving the host machine's resources that would otherwise have been spent in supporting the OS idle loop execution. If another processor initiates an inter-processor message directed to a processor whose OS program flow has been skipped forward, that processor is capable of skipping backward in time, if necessary, to service the inter-processor message.

In an exemplary embodiment, a simulator application program interface (API) routine is provided for skipping the OS program flow either forward or backward by a fixed amount of time based on a timer input, or by an unbounded time based on an external event such as an interrupt. Appropriate arguments in the simulator API routine are accordingly provided.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
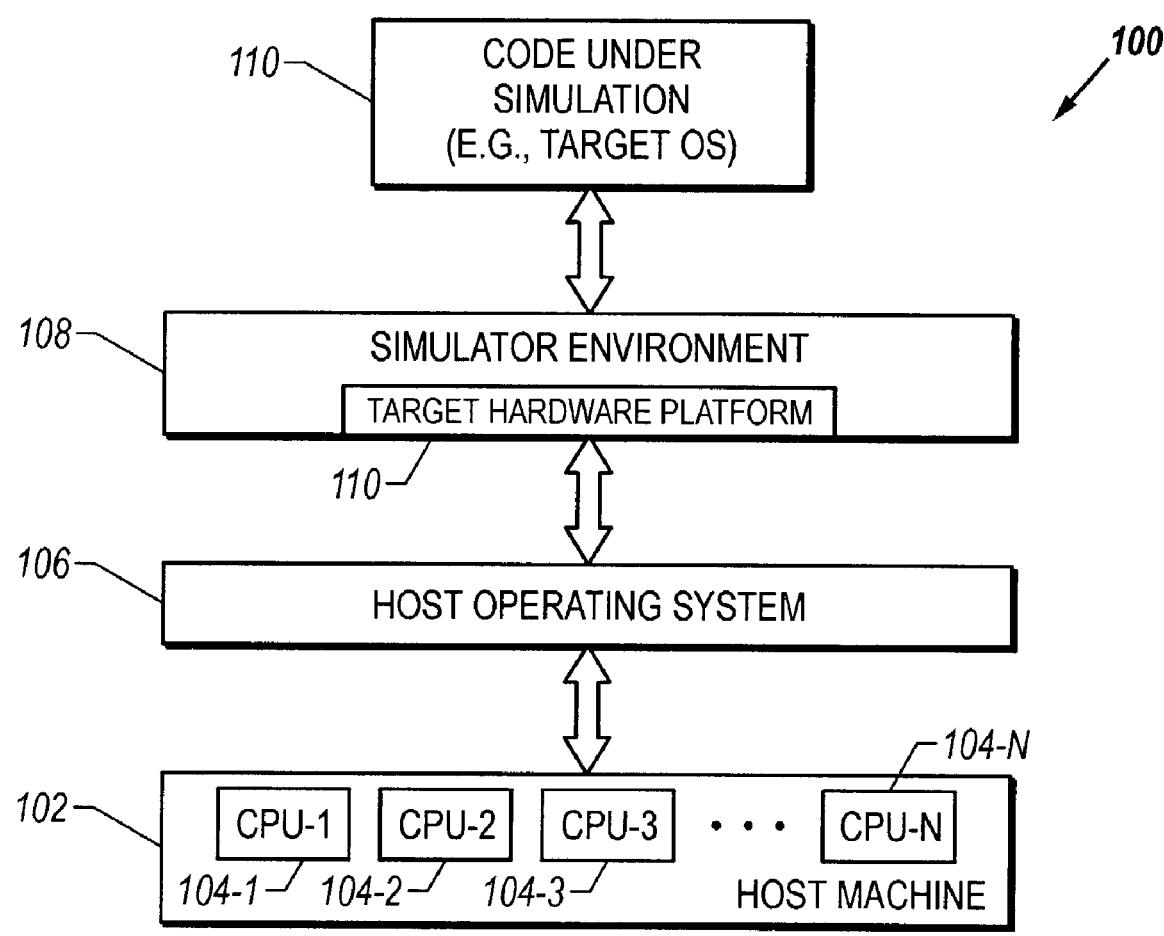
FIG. 1 depicts an exemplary simulator environment wherein the teachings of the present invention may be advantageously practiced.

In the drawings, like or similar elements are designated with identical reference numerals throughout the several views thereof, and the various elements depicted are not necessarily drawn to scale. Referring now to FIG. 1, depicted therein is an exemplary simulator system 100 wherein the teachings of the present invention may be advantageously practiced for increasing OS idle loop performance and efficiency therein. A host machine 102 is provided for executing any known or heretofore unknown simulator operable to simulate a target hardware platform. The host machine's hardware may be architected to include one or more processors, in addition to other known devices such as, e.g., timers, input/output (I/O) devices, co-processors, accelerators, system storage, et cetera. Reference numerals 104-1 through 104-N refer to a plurality of processors (CPU-1 through CPU-N) of the host machine, which may be implemented in any known multiprocessor (MP) computer system configuration. A host Operating System (OS) 106 running on the host machine 102 is operable to support a simulator environment 108 that is specific to a selected target platform. Reference numeral 110 refers to an exemplary target platform simulated by the simulator, which platform can include either a single-processor platform or a multi-CPU computer system having two or more simulated processors. Thus, where a multi-CPU system is being simulated, the simulated target hardware platform 110 can be any of known or heretofore unknown MP environments including loosely- or tightly-coupled MP systems, symmetrical or asymmetrical MP architectures, and the like.

The simulator environment 108 is operable to execute program code (i.e., code under simulation) 112 intended to run on a target platform. In particular, an OS program operable to run on the target hardware is provided as code under simulation for purposes of the present patent application. Accordingly, the OS under simulation is compatible with a single simulated processor or operable to run on the multiple simulated processors of the exemplary target hardware platform.

In the case of multi-CPU implementation in general, when the simulator environment is instantiated on the host machine, a plurality of simulated processors are initialized as part of specifying the target hardware platform. When a program is executed in the simulator environment, a "run list" of the simulated CPUs is maintained for executing the program code under simulation. Additional details regarding a multi-CPU run list are provided in the following commonly owned co-pending patent application(s) (i) "System And Method For Increasing Performance In Multi-CPU Simulation," filed even date herewith, application Ser. No. 10/178,967, now U.S. Patent Application Publication No. 2003/0237076 A1, cross-referenced hereinabove.

When the OS program is simulated in a multi-CPU target platform, the various simulated processors are operable to execute the instructions of the OS program code by effectuating fetch/execute (F/E) cycles in some order as the time progresses. For instance, the execution flow may be initiated at a first simulated processor with one F/E cycle, the next simulated processor executing the following F/E cycle, and so on, until the first simulated processor re-commences whichever F/E cycle it encounters in the program. Analogously, in the case of a single processor environment (which may be thought of as having a run list of one processor), the same processor continues to execute the F/E cycles associated with the OS program flow in accordance with a predetermined sequence.

Regardless of whether a single-CPU or multi-CPU simulator environment is implemented, when the OS code is executed in the simulator environment 108, the underlying host resources themselves, e.g., host CPUs, memory, etc., are consumed also. Furthermore, as pointed out in the Background section of the present patent application, the host resources are consumed even when the OS code enters idle loops, thereby generating inefficiencies in the simulator environment.

Figure 2:
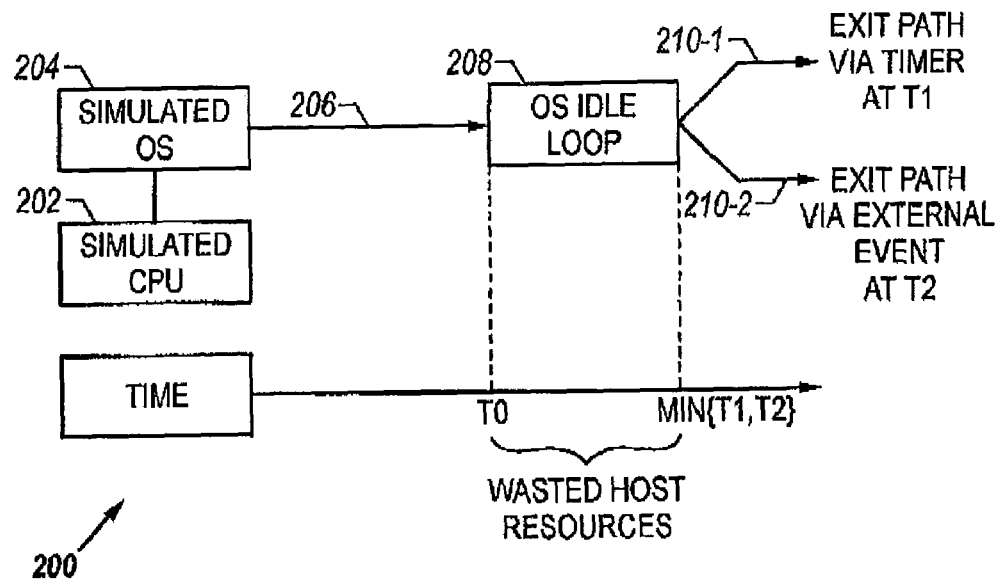
FIG. 2 (Prior Art) depicts a conventional program flow in a simulator system wherein an OS enters into an idle loop condition.

FIG. 2 depicts a conventional program flow 200 in a single-processor simulator system wherein an OS 204 enters an idle loop condition. A single simulated processor 202 is operable to execute the OS 204 in a predetermined fashion as the simulated run time progresses. Reference numeral 206 symbolically refers to the OS's program flow in the simulator environment. At time T0, the program flow encounters an idle loop condition 208 in the OS code, wherein no "useful" work is performed by the OS. In other words, while the OS is required to maintain different clocks, timers, and related states pertaining to the simulated execution environment, it does not schedule any user processes. However, the underlying host machine continues to expend its real resources, e.g., processor cycles, memory accesses, etc., during the OS idle loop execution in the simulator environment.

In conventional implementations, the OS program flow remains in the idle loop condition until either of the following two conditions takes place. An exit path 210-1 from the idle loop condition may be effectuated when a fixed time based on a timer setting associated with the CPU 202 elapses. For purposes of illustration, time T1 is assumed to be the time when the timer input is directed to the OS. Also, the OS program flow can be ejected from the idle loop condition 208 when an external event, e.g., an interrupt, is directed to the CPU 202, for instance, at time T2. Accordingly, the OS program flow remains in the idle loop condition for the duration from T0 to min{T1,T2}, contributing to the wastage of the host machine resources.

Figure 3:
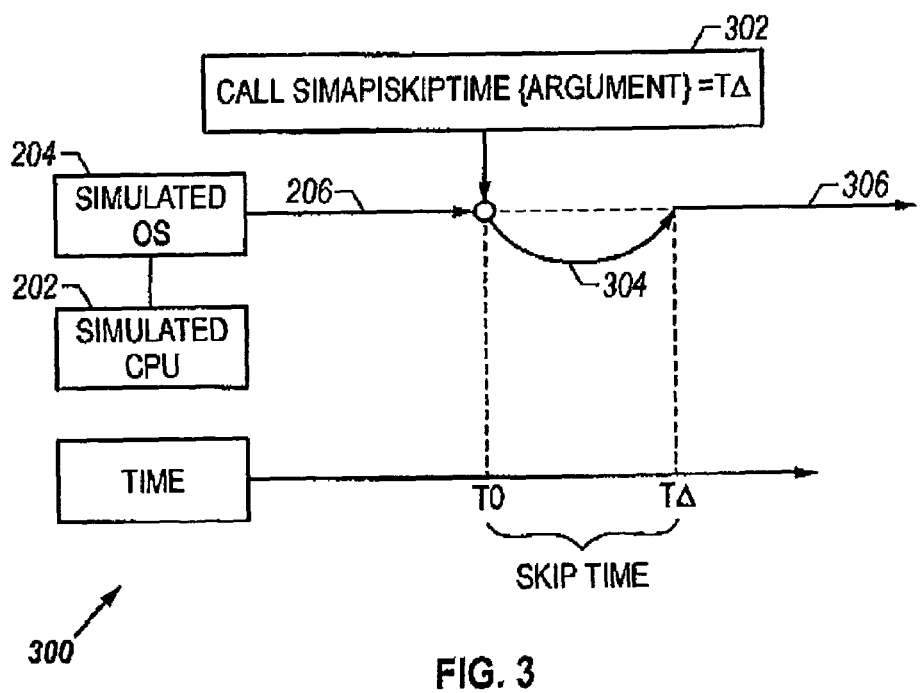
FIG. 3 depicts an exemplary program flow in a simulator system wherein an OS in idle loop condition jumps ahead in accordance with the teachings of the present invention.

Referring now to FIG. 3, depicted therein is an exemplary program flow 300 in a single-processor simulator system wherein the OS program 204 advantageously avoids idle loop conditions in accordance with the teachings of the present invention. As before, the simulated CPU 202 continues to execute the OS program 204 until an idle loop condition is encountered at time T0. In accordance with the teachings of the present invention, a simulator application program interface (API) routine 302, referred to as SimApiSkipTime{arguments}, is called at time T0 upon identifying that the OS program code is about to enter an idle loop phase. In one implementation, such idle loop phases may comprise standard, internal idle loops that the OS program code (or, any other application, for that matter) may typically be provided with in order that certain asynchronous events (e.g., an I/O event) take place before continuing. Also, idle loops may be inserted in the program code at selected points.

In general, the SimApiSkipTime routine is inserted in the program code as part of its flow to be called out at appropriate times where the idle loops exist. In one exemplary embodiment, the SimApiSkipTime routine may include a single argument specifying a time duration or a target time is provided, and when the simulator API routine 302 is executed on the simulated CPU 202, it causes the OS program flow to skip ahead by an amount of time in accordance with the routine's argument. Thus, the run time associated with the OS program flow jumps to a time $T_A$ without the OS having to execute the idle loop instructions. Further, the state of the simulated CPU 202 is updated such that it is rendered commensurate with the OS state at time $T_A$. Reference numeral 304 symbolically refers to the action of skipping ahead in the OS program flow.

As pointed out earlier, the OS can remain in an idle loop condition based on two events, i.e., a timer-based input or an external interrupt event. If these two events were to occur at two different times, the time duration that the OS program flow is required to skip will be the difference between the initial time T0 and the minimum of the times associated with the two events, i.e., T1 and T2. Accordingly, the simulator API routine's argument takes the form $T_A$=|T0−min{T1, T2}|. Upon jumping ahead to time $T_A$, the OS program flow continues to be executed in normal manner, as symbolically shown by program flow path 306.

In an exemplary preferred implementation, the simulator API routine of the present invention is introduced into the onset of the OS idle loops by specifying appropriate amounts of time for skipping. As another variation, the SimApiSkipTime routine can take {−1} as an argument, whereby an unbounded amount of time may be skipped in the OS's program flow. It should be appreciated that because the simulated processor 202 will not execute any instructions during the time being skipped, the host resources are thereby conserved and the simulator environment's performance becomes more efficient as a consequence.

Figure 4:
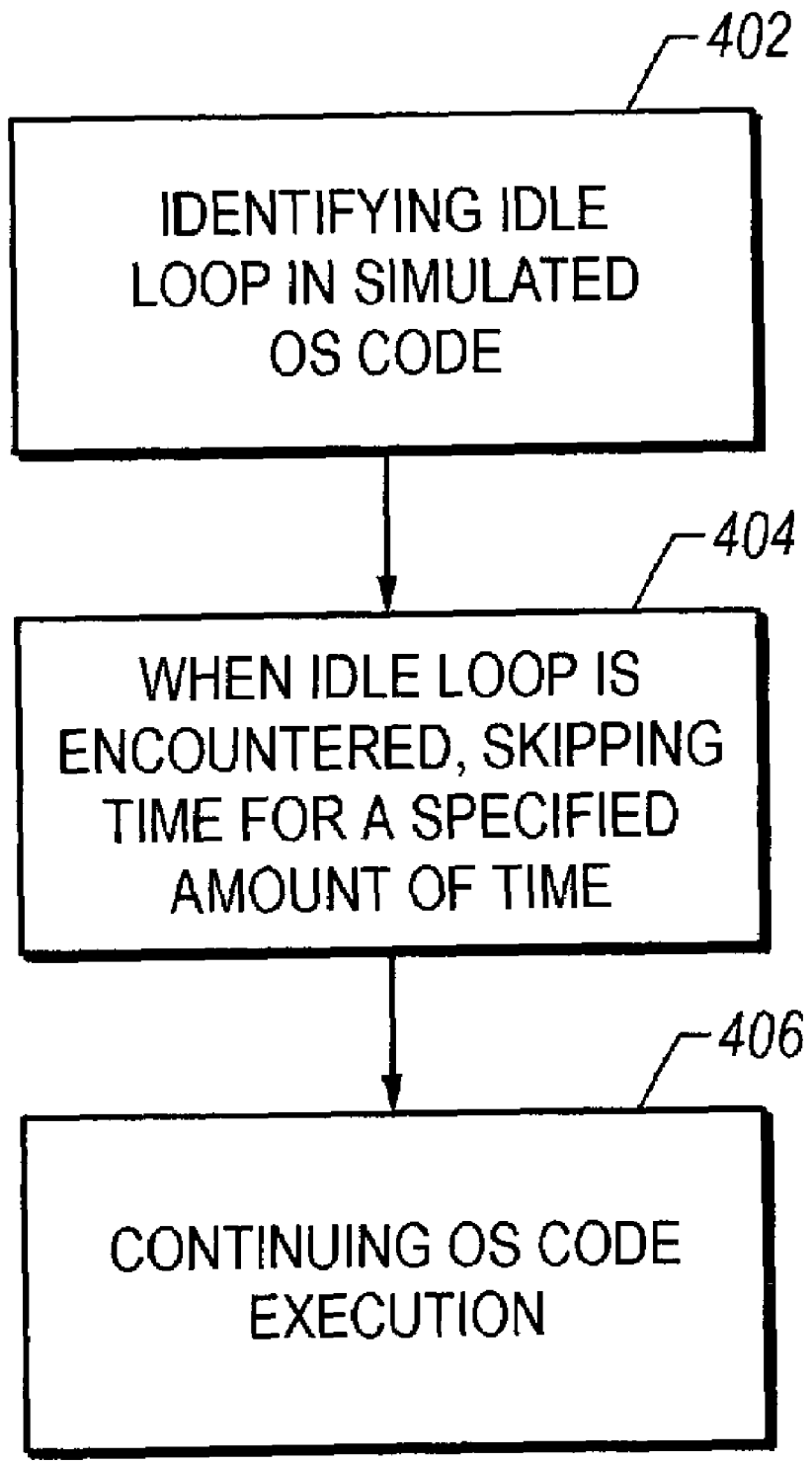
FIG. 4 is a flow chart of the steps involved in an exemplary methodology of the present invention to increase the OS idle loop performance in a single-CPU simulator environment.

FIG. 4 is a flow chart of an exemplary methodology of the present invention that captures the various steps set forth above. Upon identifying, manually or automatically, one or more idle loops in an OS program operable to be executed in a simulator environment, the SimApiSkipTime routine with appropriate arguments is introduced at select points of the OS code (step 402). When an idle loop is encountered during the OS program flow on a simulated processor, the SimApiSkipTime routine is executed that causes the program flow to skip a specified amount of time, thereby obviating the need to perform idle loop instructions by the simulated processor (step 404). Afterwards, the OS program code continues to be executed in normal manner in the simulator environment (step 406).

Figure 5:
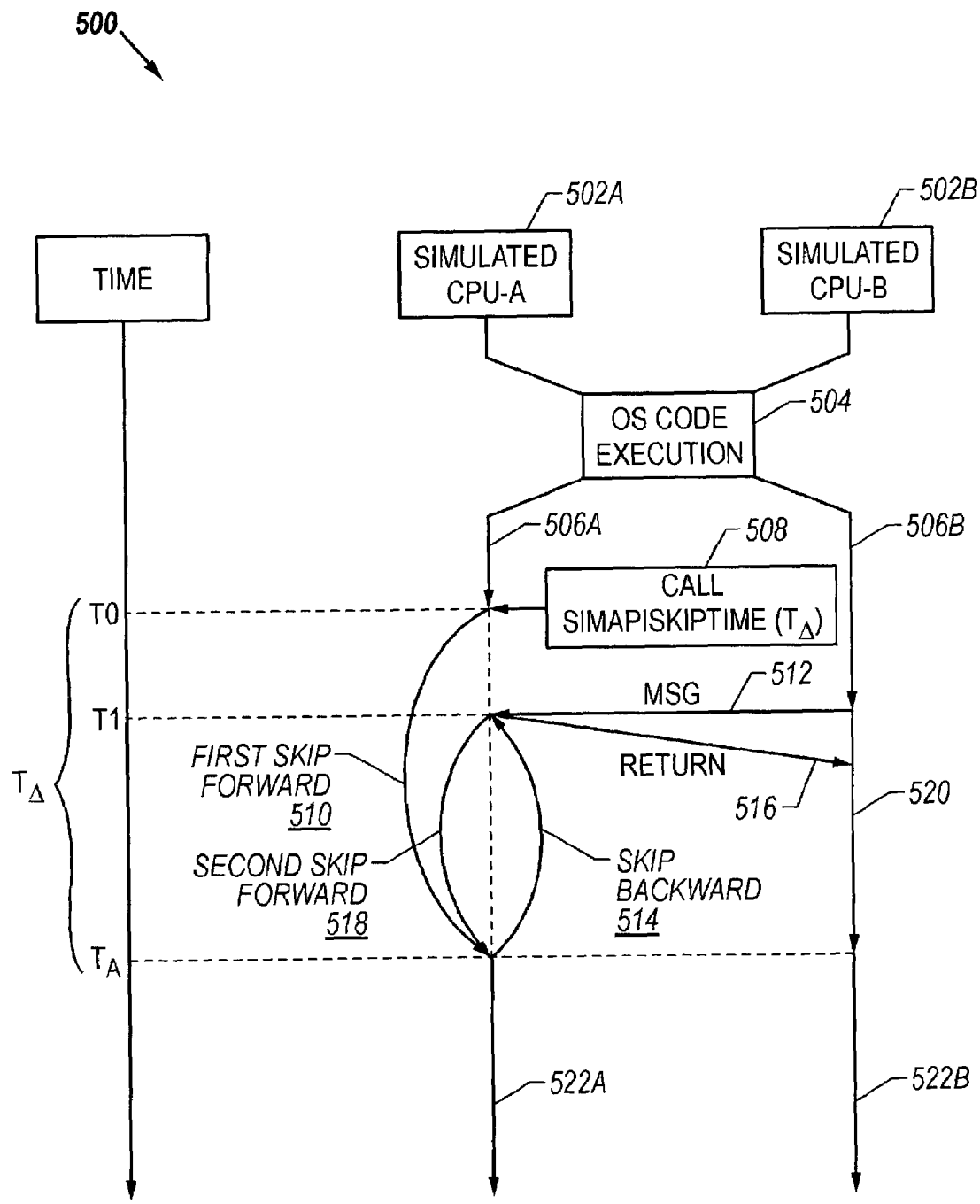
FIG. 5 depicts an exemplary program flow in a simulator system with two simulated CPUs with increased OS idle loop performance in accordance with the teachings of the present invention.

Referring now to FIG. 5, depicted therein is an exemplary program flow 500 in a multi-CPU simulator system, e.g., having two simulated processors, with increased OS idle loop performance in accordance with the teachings of the present invention. Reference numerals 502A and 502B refer to the two processors, CPU-A and CPU-B, of the simulator system operable to execute an OS program. Program flow paths 506A and 506B are symbolic representations of the program flow with respect to OS code execution 504 on the two processors, respectively, wherein each processor is operable to effectuate the program code's F/E cycles in some order.

At time T0, the OS code portion running on CPU-A 502A encounters an idle loop condition and the SimApiSkipTime routine is accordingly called out (because the routine is inserted thereat) in order to skip ahead the OS program's flow on CPU-A by a specified amount of time $T_A$. Reference numeral 510 symbolically refers to the skipping ahead of CPU-A 502A and its OS program flow to $T_A$, where $T_A$=T0+$T_A$. Once CPU-A and the OS program flow thereon are updated to a simulator run time of $T_A$, the code execution on CPU-A 502A stops temporarily until the OS program flow on CPU-B 502B catches up, which may not be aware of the "time-skipping" by CPU-A 502A.

By way of illustration, CPU-B 502B generates an inter-processor message 512 (e.g., a inter-processor interrupt) directed to CPU-A 502A at time T1. Since CPU-A is already at a run time of $T_A$ which is ahead of T1, it executes responsive to the receipt of the message 512 another SimApiSkipTime routine with appropriate arguments to indicate a skip backward in time to T1. Reference numeral 514 is symbolic of the action of skipping backward of CPU-A 502A and its OS program state. Upon servicing the message 512 at time T1, CPU-A 502A sends a return message 516 to CPU-B 502B in response thereto. Thereafter, the program flow continues on CPU-B 502B as symbolized by reference numeral 520.

In the meantime, CPU-A 502A and its OS program state are operable to jump forward again to the time $T_A$, using yet another SimApiSkipTime routine with appropriate arguments to indicate the forward direction as well as the amount of time to skip (i.e., $|T_A-T1|$). Reference numeral 518 refers to the second forward skipping action of CPU-A and its OS program state. Once again, when CPU-A and the OS program flow thereon are updated to a simulator run time of $T0+T_A$ due to the second forwarding skipping action, the code execution on CPU-A stops temporarily until the OS program flow on CPU-B 502B catches up. Thereafter, both CPU-A and CPU-B continue their respective OS program flows 522A and 522B.

Figure 6:
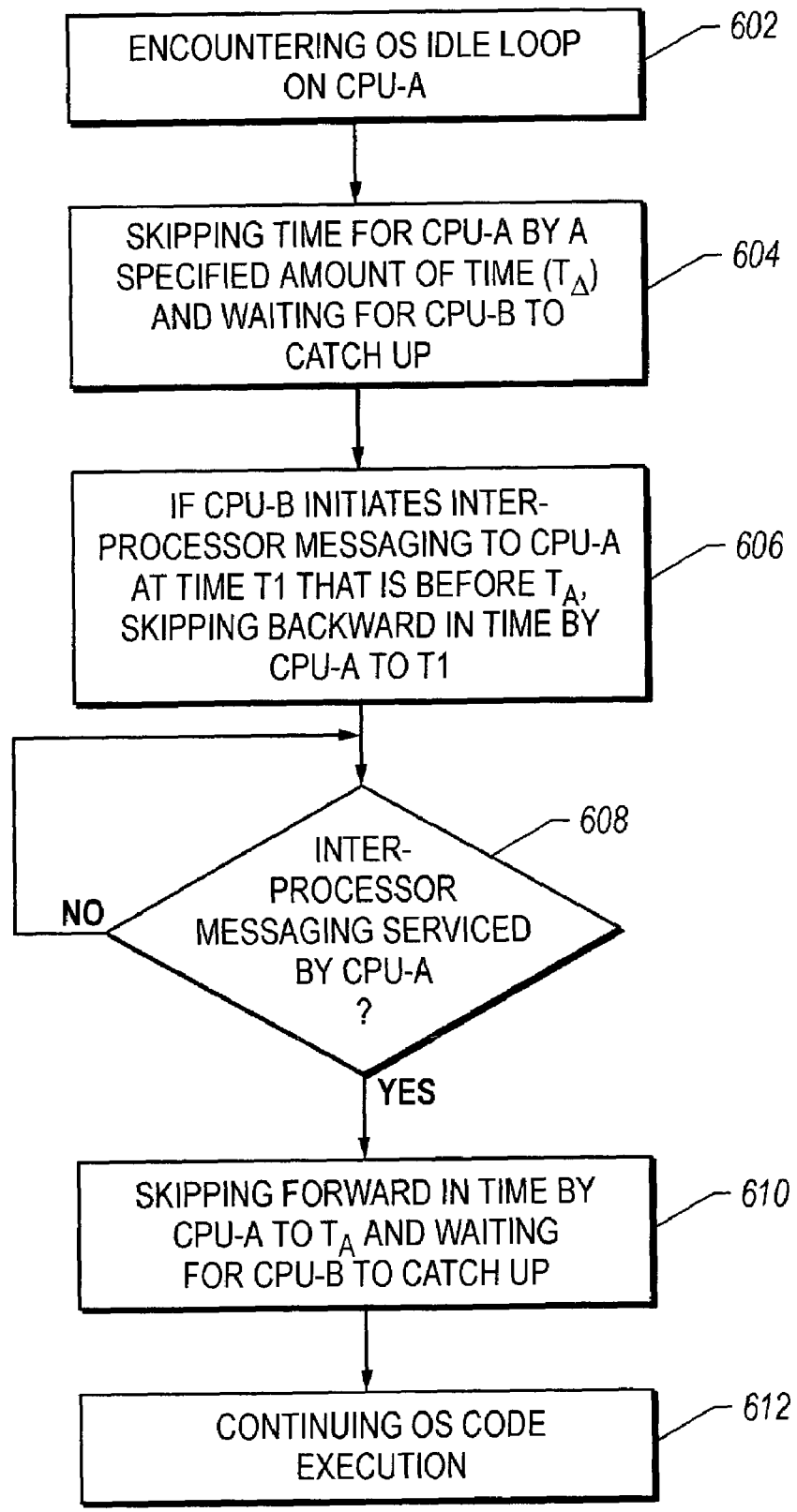
FIG. 6 a flow chart of the steps involved in an exemplary methodology of the present invention to increase the OS idle loop performance in a multi-CPU simulator environment.

FIG. 6 is a flow chart of an exemplary methodology of the present invention that captures the various steps set forth above with respect to increasing OS idle loop performance in a multi-CPU simulation environment. Upon encountering an OS idle loop condition on a first processor (step 602), the program flow thereon skips ahead by a predetermined amount of time (step 604). In one implementation, once the first processor and its OS state are updated to a "future" time (i.e., $T_A$), the program flow stops thereat in order to allow the flow execution on the remaining processors (e.g., a second processor) to catch up.

If the second processor initiates an inter-processor message directed to the first processor at time T1, where T1 is earlier than the future time $T_A$, the first processor skips backward to T1 in order to service the message. Step 606 and decision block 608 illustrate these processes. Upon servicing the inter-processor message, the first processor with its OS state skips forward again to time $T_A$ and waits for the other processor to catch up (step 610). Subsequently, the OS code execution continues on the processors in normal fashion (step 612).

Based upon the foregoing Detailed Description, it should be appreciated that the present invention provides an innovative scheme for increasing the OS idle loop performance in a simulation environment by advantageously skipping a predetermined amount of time that would otherwise have entailed execution of idle loop instructions. Since the simulated processor or processors are forced to skip idle loops, the host hardware resources are not unnecessarily exhausted and the simulator's performance is thereby enhanced. Those skilled in the art should recognize that the present invention is particularly advantageous in a lightly loaded OS where it typically spends a significant amount of time in executing idle loop instructions while waiting for an external event to occur or for time to pass.

It is believed that the operation and construction of the present invention will be apparent from the foregoing Detailed Description. While the system and method shown and described have been characterized as being preferred, it should be readily understood that various changes and modifications could be made therein without departing from the scope of the present invention as set forth in the following claims.

What is claimed is:

1. A computer-implemented method of improving performance in a simulator environment operable to simulate a platform having a plurality of simulated processors, said platform running an Operating System (OS) program, the method comprising:

skipping ahead said OS program's flow on a first simulated processor by an amount of time ($T_A$) in response to said OS program entering an idle loop condition at time $T_0$ on said first simulated processor, thereby avoiding said idle loop condition by said OS program such that execution of instructions is inhibited on said first simulated processor; and continuing to execute said OS program on said first simulated processor after skipping ahead by said amount of time $T_A$, whereby system resources associated with a host system upon which said simulator environment is executed are conserved.

2. The computer-implemented method of improving performance in a simulator environment as set forth in claim 1, wherein said first simulated processor's flow is skipped ahead from time $T_0$ by said amount of time $T_A$, the method further comprising the step of continuing to execute said OS program on a second simulated processor during said time $T_A$.

3. The computer-implemented method of improving performance in a simulator environment as set forth in claim 1, wherein said first simulated processor's flow is skipped ahead to a time $T_A$ that is equal to $T_0+T_A$, the method further comprising: upon receiving an inter-processor message from a second simulated processor directed to said first simulated processor at time $T_1$, where T1 is between $T_0$ and $T_A$, skipping backward said OS program's flow on said first simulated processor to time $T_1$, servicing said inter-processor message by said first simulated processor, and thereafter, skipping forward said OS program's flow on said first simulated processor to time $T_A$.

4. The computer-implemented method of improving performance in a simulator environment as set forth in claim 1, wherein said amount of time $T_A$ is predetermined.

5. The computer-implemented method of improving performance in a simulator environment as set forth in claim 1, wherein said amount of time $T_A$ is determined based on an amount of time said OS program is to remain in said idle loop condition.

6. The computer-implemented method of improving performance in a simulator environment as set forth in claim 1, wherein said amount of time $T_A$ is determined based on when an external interrupt is to be serviced by said OS program.

7. The computer-implemented method of improving performance in a simulator environment as set forth in claim 1, wherein said amount of time $T_A$ is determined pursuant to a timer-based time duration.

8. The computer-implemented method of improving performance in a simulator environment as set forth in claim 1, wherein said amount of time $T_A$ is determined based on a minimum of a timer-based time duration and the time when an external interrupt is to be serviced by said OS program.

9. The computer-implemented method of improving performance in a simulator environment as set forth in claim 1, wherein said step of skipping ahead said OS program's flow is effectuated by executing a simulator application program interface (API) routine operable to be executed on said platform.

10. A computer-implemented system for improving performance in a simulator environment operable to simulate a platform having a plurality of simulated processors, said platform running an Operating System (OS) program, the system comprising:

means for skipping ahead said OS program's flow on a first simulated processor by a predetermined amount of time $T_A$ in response to said OS program entering an idle loop condition at time $T_0$ on said first simulated processor, thereby avoiding said idle loop condition by said OS program such that execution of instructions is inhibited on said first simulated processor; and means for continuing to execute said OS program on said first simulated processor after skipping ahead by said amount of time $T_A$, whereby system resources associated with a host system upon which said simulator environment is executed are conserved.

11. The computer-implemented system for improving performance in a simulator environment as set forth in claim 10, wherein said first simulated processor's flow is skipped ahead from time $T_0$ by said amount of time $T_A$, the system further comprising means for continuing to execute said OS program on a second simulated processor during said time $T_A$.

12. The computer-implemented system for improving performance in a simulator environment as set forth in claim 10, wherein said first simulated processor's flow is skipped ahead to a time $T_A$ that is equal to $T_0+T_A$, the system further comprising:

responsive to a second simulated processor initiating an inter-processor message directed to said first processor at time $T_1$ that is between $T_0$ and $T_A$, means for skipping backward said OS program's flow on said first processor to time $T_1$, means for servicing said inter-processor message by said first simulated processor, and means for skipping forward said OS program's flow on said first simulated processor to time $T_A$ after servicing said inter-processor message.

13. The computer-implemented system for improving performance in a simulator environment as set forth in claim 10, wherein said amount of time $T_A$ is predetermined.

14. The computer-implemented system for improving performance in a simulator environment as set forth in claim 10, wherein said amount of time $T_A$ is determined based on an amount of time said OS program is to remain in said idle loop condition.

15. The computer-implemented system for improving performance in a simulator environment as set forth in claim 10, wherein said amount of time $T_A$ is determined based on when an external interrupt is to be serviced by said OS program.

16. The computer-implemented system for improving performance in a simulator environment as set forth in claim 10, wherein said amount of time $T_A$ is determined pursuant to a timer-based time duration.

17. The computer-implemented system for improving performance in a simulator environment as set forth in claim 10, wherein said amount of time $T_A$ is determined based on a minimum of a timer-based time duration and the time when an external interrupt is to be serviced by said OS program.

18. The computer-implemented system for improving performance in a simulator environment as set forth in claim 10, wherein said means for skipping ahead said OS program's flow comprises a simulator application program interface (API) routine operable to be executed on said platform.

19. A computer-implemented method of improving performance in a simulator environment operable to simulate a multiprocessor platform, said multiprocessor platform running an Operating System (OS) program, the method comprising:

upon encountering an OS idle loop condition at time $T_0$ on a first simulated processor, skipping ahead said OS program's flow on said first simulated processor by an amount of time $T_A$ to time $T_A$, thereby avoiding said idle loop condition by said OS program such that execution of instructions is inhibited on said first simulated processor; and responsive to a second simulated processor initiating an inter-processor message directed to said first processor at time $T_1$, where $T_1$ is between $T_0$ and $T_A$, skipping backward said OS program's flow on said first simulated processor to time $T_1$, servicing said inter-processor message by said first simulated processor, and thereafter, skipping forward said OS program's flow on said first simulated processor to time $T_A$, whereby system resources associated with a host system upon which said simulator environment is executed are conserved.

20. The computer-implemented method of improving performance in a simulator environment as set forth in claim 19, further comprising the step of continuing to execute said OS program on said first and second simulated processors when said second simulated processor reaches time $T_A$.

21. The computer-implemented method of improving performance in a simulator environment as set forth in claim 19, further comprising the step of providing a return message by said first simulated processor to said second simulated processor in response to said inter-processor message.

22. The computer-implemented method of improving performance in a simulator environment as set forth in claim 19, wherein said step of skipping ahead said OS program's flow on said first simulated processor is effectuated by a simulator application program interface (API) routine operable to be executed on said first simulated processor.

23. The computer-implemented method of improving performance in a simulator environment as set forth in claim 19, wherein said step of skipping backward said OS program's flow on said first simulated processor is effectuated by a simulator API routine operable to be executed on said first simulated processor.

24. The computer-implemented method of improving performance in a simulator environment as set forth in claim 19, wherein said inter-processor message comprises an interrupt.

25. The computer-implemented method of improving performance in a simulator environment as set forth in claim 19, wherein said amount of time $T_A$ is determined based on a minimum of a timer-based time duration associated with said first simulated processor and the time when an external interrupt is to be serviced by said first simulated processor.

26. A computer-implemented system for improving performance in a simulator environment operable to simulate a multiprocessor platform, said multiprocessor platform running an Operating System (OS) program, the system comprising:

means for skipping ahead said OS program's flow on a first simulated processor by an amount of time $T_A$ to time $T_A$ upon encountering an OS idle loop condition at time $T_0$ on said first simulated processor, thereby avoiding said idle loop condition by said OS program such that execution of instructions is inhibited on said first simulated processor;

means for skipping backward said OS program's flow on said first simulated processor to time $T_1$, which is between $T_0$ and $T_A$, said means operating responsive to a second simulated processor initiating an inter-processor message directed to said first simulated processor at time $T_1$; and means for skipping forward said OS program's flow on said first simulated processor to time $T_A$ upon servicing said inter-processor message by said first simulated processor, whereby system resources associated with a host system upon which said simulator environment is executed are conserved.

27. The computer-implemented system for improving performance in a simulator environment as set forth in claim 26, wherein said means for skipping ahead said OS program's flow on said first simulated processor by said amount of time $T_A$ to time $T_A$ comprises a simulator application program interface (API) routine operable to be executed on said first simulated processor.

28. The computer-implemented system for improving performance in a simulator environment as set forth in claim 26, wherein said means for skipping backward said OS program's flow on said first simulated processor to time $T_1$ comprises a simulator API routine operable to be executed on said first simulated processor.

29. The computer-implemented system for improving performance in a simulator environment as set forth in claim 26, wherein said amount of time $T_A$ is determined based on a minimum of a timer-based time duration associated with said first simulated processor and the time when an external interrupt is to be serviced by said first simulated processor.

* * * * *

UNITED STATES PATENT AND TRADEMARK OFFICE
CERTIFICATE OF CORRECTION

| | |
|---|---|
| PATENT NO. | : 7,343,590 B2 |
| APPLICATION NO. | : 10/178992 |
| DATED | : March 11, 2008 |
| INVENTOR(S) | : Daniel Tormey et al. |

It is certified that error appears in the above-identified patent and that said Letters Patent is hereby corrected as shown below:

On the Title page, in field (56), under "U.S. Patent Documents", in column 2, line 7, delete "2005/0246565" and insert -- 2005/0246465 --, therefor.

On the Title page, in field (56), under "Other Publications", in column 2, lines 1-3, delete "John Sanguinetti, A Technique for Integrating Simulation and System Design, 1979 Conference on Simulation, Measurement and Modeling of Computer Systems, pp. 163-172.*".

Title page 2, in field (56), under "Other Publications", in column 1, lines 1-8, delete "Richard M. Fujimoto, "Parallel Discrete Event Simulation", Communication of the ACM, Oct. 1990.*
J. Sanguinetti "A technique for Integrating Simulation and System Design" 1979 Conference on Simulation, pp. 163-172.*
R. M. Fujimoto, "Parallel Discrete Event Simulation", communication of the ACM, Oct. 1990.*
J. Sanguinetti, "A technique for Integrating Simulation and System Design", 1979 Conference on Simulation.*".

Title page 2, in field (56), under "Other Publications", in column 2, lines 4-11, delete "Richard M. Fujimoto, "Parallel Discrete Event Simulation", Communication of the ACM, Oct. 1990, vol. 33, No. 10, pp. 30-53.*
G. Chen, and B. K. Szymanski, "Lookahead, Rollback, and Lookback: Searching for Parallelism in Discrete Event Simulation," pp. 1-5, extra page showing the creation of PDF, Jun. 2002. *
J. Sanguinetti, "A Technique for Integrating Simulation and System Design," 1979 Conference on Simulation, Measurement and Modeling of Computer Systems, pp. 163-172,*".

UNITED STATES PATENT AND TRADEMARK OFFICE
CERTIFICATE OF CORRECTION

PATENT NO.         : 7,343,590 B2
APPLICATION NO. : 10/178992
DATED               : March 11, 2008
INVENTOR(S)      : Daniel Tormey et al.

It is certified that error appears in the above-identified patent and that said Letters Patent is hereby corrected as shown below:

In column 8, line 16, in Claim 3, delete "$T_\Delta$" and insert -- $T_A$ --, therefor.

In column 9, line 17, in Claim 12, delete "$T_\Delta$" and insert -- $T_A$ --, therefor.

Signed and Sealed this

Twenty-fifth Day of August, 2009

David J. Kappos
*Director of the United States Patent and Trademark Office*